TUNING INTEGRATED CIRCUIT COMPRISING A LAYER OF PIEZOELECTRIC MATERIAL ABOVE A SEMICONDUCTOR BODY

Filed Aug. 23, 1968

WITNESSES

Theodore F. Wrobel

James F. Young

INVENTOR

Derrick J. Page

BY Gordon H. Telfer

ATTORNEY

United States Patent Office 3,548,346
Patented Dec. 15, 1970

3,548,346

TUNING INTEGRATED CIRCUITS COMPRISING A LAYER OF PIEZOELECTRIC MATERIAL ABOVE A SEMICONDUCTOR BODY

Derrick J. Page, Export, Pa., assignor to Westinghouse Electric Corporation, Pittsburgh, Pa., a corporation of Pennsylvania Filed Aug. 23, 1968, Ser. No. 754,907
Int. Cl. H03h *9/16, 9/24*
U.S. Cl. 333—72 3 Claims

ABSTRACT OF THE DISCLOSURE

A piezoelectric resonator is combined with a semiconductor body to provide a composite thickness mode resonator wherein the semiconductor body includes other active and/or passive elements of an integrated circuit. The semiconductor body has an acoustic thickness that is an integral multiple of the acoustic thickness of the piezoelectric layer on its surface.

BACKGROUND OF THE INVENTION

Field of the invention

The invention concerns means for imparting frequency selectivity to semiconductor devices, particularly integrated circuits, wherein the principal resonant element is intimately associated with the semiconductor.

Brief description of the prior art

Various means have been proposed to incorporate with a semiconductor integrated circuit some frequency selective means to tune the integrated circuit. A discussion of the problem and various proposals addressed to its solution may be found in articles by W. E. Newell appearing in: Electronics, pp. 50–52, Mar. 13, 1964; Proc. IEEE, vol. 52, pp. 1603–1608, December 1964; and Proc. IEEE, vol. 53, pp. 1305–1309, October 1965.

Among the prior proposals is that referred to as a "tunistor" device which is the subject matter of copending application Ser. No. 649,214, filed June 27, 1967 by W. E. Newell and assigned to the assignee of the present invention. Briefly, the "tunistor" device employs a semiconductor body as a vibratory member with layers of piezoelectric material thereon for input and output transducers. While some success has been achieved with this device it requires certain fabrication techniques to permit motion of the semiconductor body that are not inherent in present day integrated circuit fabrication and, also, typical available frequencies in the range from about 50 kiloHertz to about 10 megaHertz are too low for some applications of interest.

In the field of discrete piezoelectric resonators it has been proposed to extend the range of quartz crystal resonators by the application of a layer of another piezoelectric material such as cadmium sulfide. Reference may be made to an article by T. R. Sliker and D. A. Roberts, Journal of Applied Physics, vol. 38, page 2350, April 1967, for further description of this technique. Such a combination does not provide an integrated tuning device and is mentioned merely to indicate the state of the art with respect to the utilization of piezoelectric films in combination with another medium.

SUMMARY OF THE INVENTION

Among the objects of this invention are to provide a tuning device for integrated circuits without imposing difficult requirements on the mounting of the semiconductor body or otherwise impairing fabrication ease to a substantial degree. An additional purpose of this invention is to provide an integrated tuning device for frequencies substantially in excess of 10 megaHertz.

The above-mentioned and additional objects and advantages of this invention are brought about through the use of a piezoelectric resonator in acoustic association with a semiconductor body that contains active and/or passive elements of what may be a conventional integrated circuit to which the resonator imparts frequency selective properties. The semiconductor body has an acoustic thickness that is an integral multiple of the acoustic thickness of the piezoelectric layer so that the acoustic wave generated in the resonator produces a corresponding standing wave in the semiconductor body that is reflected from its opposite surface and maintains resonance although the semiconductor body is not itself active, to any appreciable degree, in the sense of the occurrence of electromechanical conversion therein.

The piezoelectric layer may be formed directly on a surface of an otherwise conventional integrated circuit and the composite may be solidly mounted by any of the variety of techniques employed for integrated circuits. Since the resonant frequency is determined by the piezoelectric layer itself, frequencies well in excess of 100 megaHertz are readily attainable.

DESCRIPTION OF THE PREFERRED EMBODIMENTS

Figure 1:
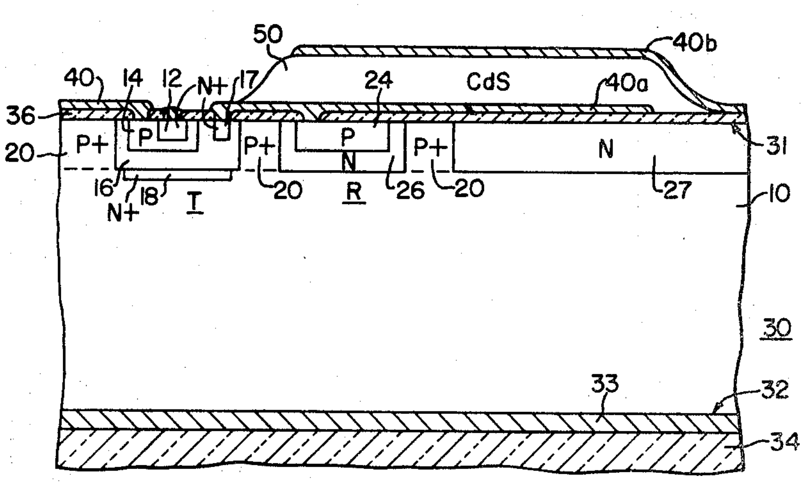
FIG. 1 is a partial sectional view of a semiconductor integrated circuit including a tuning device in accordance with this invention.

FIG. 1 shows part of a typical semiconductor integrated circuit generally in accordance with the present practice with, however, the addition of a tuning device in accordance with the present invention. The details of the internal semiconductor structure and its fabrication will only be briefly described because such structures are well known and descriptions of them readily available elsewhere.

Starting with a monocrystalline substrate 10 of P-type silicon that is of usual device quality material, various epitaxial growth and selective diffusion operations are performed to provide internally isolated electronic elements within a unitary body 30. One such element is a transistor T comprising an N+ emitter region 12, a P type base region 14, and an N type collector region including a principal portion 16 as well as an N+ collector contact region 17 and an N+ buried collector region 18.

Another element illustrated is a resistor R comprising a P-type region 24 that is like the transistor base region 14 in thickness and impurity concentration gradient. The various N-type regions 16, 26 and 27 may be, as usual, parts of an epitaxial layer deposited on the substrate 10 and subsequently divided by the diffusion of P+ isolation walls 20. The N-type region 27 to the right of the resistor R may, of course, contain an additional element.

The major surfaces 31 and 32 of the semiconductor body 30 are essentially planar and parallel. The lower surface 32 is illustrated solidly mounted to a support 34, such as one of a ceramic material, by means of a fused metal layer in accordance with the usual practice.

The upper surface 31 of semiconductor body 30 has thereon an insulating layer 36, such as one of silicon dioxide or a combination of layers of silicon dioxide and silicon nitride, with openings through the insulating layer to provide access for conductive contacts to the various semiconductive regions. The surface of the insulating layer is metallized as by an aluminum layer 40 conventionally processed to provide the contacts and the interconnections between various elements. In the resistor structure only a single contact is illustrated in this example, it being understood that the other resistor contact would be elsewhere rather than in the plane of the section illustrated.

In this example, an extension 40*a* of the interconnection between the transistor collector contact region 17 and the resistor 24 is formed over a relatively large area of the insulator surface and provides a metal electrode. On the metal electrode 40*a* is deposited a layer 50 of piezoelectric material, such as cadmium sulfide, and, subsequently, a second metal electrode layer 40*b*. Thus, there occurs between the parallel spaced metal electrode layers 40*a* and 40*b* a body 50 of piezoelectric material to which may be applied a signal for establishing a standing acoustic wave which is then propagated in the semiconductor body 30 and reflected by its opposite surface 32.

The acoustic wave will be strongest when the frequency of the applied voltage signal is such that the acoustic wavelength in the piezoelectric layer is equal to twice (or $2n$ times, where $n$ is an integer) the thickness of the piezoelectric layer 50 for operation in a fundamental mode. If the thickness of the semiconductor body 30 is chosen to be an integral number of half wavelengths, the acoustic wave reflected from the bottom face 32 will return to the piezoelectric layer 50 in phase and add constructively to the excitation of the piezoelectric layer. Hence, the device would exhibit resonance at the frequency of the applied signal. It has been found that use of a body 30 that is of a thickness greater than a single half wavelength does not result in high losses.

The Q of the device will be determined by a number of factors including the flatness of the semiconductor body and the accuracy of the piezoelectric and semiconductor thicknesses. A semiconductor wafer may be used that has been polished on both surfaces to a predetermined thickness. Since the velocity of sound in a semiconductor such as silicon is about twice that of most other materials, such as piezoelectric cadmium sulfide, the thickness of the semiconductor body is less critical than that of the piezoelectric layer.

It is possible to trim a structure to a more exact thickness for the resonant frequency of interest by depositing a layer of a material onto the back surface before permanent mounting. This layer may be of the semiconductor material, whether epitaxial or polycrystalline, or of an insulator such as silicon dioxide. By this means the effective acoustic thickness can be increased and the structure trimmed to a lower frequency of resonance. To trim to a higher resonant frequency it is possible to chemically polish the rear of the slice to reduce the thickness. During such an operation the resonant frequency may be monitored by application of signals and observation of the results.

Other semiconductor materials besides silicon may be employed for the semiconductor body. Such materials may include germanium and gallium arsenide, as examples. The particular description concerning silicon herein is in order to apply the invention to the present state of the integrated circuit art wherein silicon is by far the most widely used semiconductor material and the structure illustrated is a typical one although other elemental structures, isolation means, insulators, mounting means, and reverse conductivity type may be employed.

The piezoelectric layer 50, while conveniently of hexagonal cadmium sulfide, may be of another piezoelectric material such as suitably oriented zinc sulfide and lead zirconate-titanate.

The insulating layer 36 occurring at the upper surface of the semiconductor may be as is usually formed in integrated circuit processing having a typical maximum thickness of about 5000 angstroms to about 10,000 angstroms while only having a negligible acoustic effect. If desired and where possible, such as where insulation between the lower metal electrode 40*a* and the semiconductor is not required, the insulating layer 36 may be omitted from that portion of the structure on which the resonator is positioned. The lower metal electrode 40*a*, having a thickness of the order of one micron, also does not appreciably affect the propagation of the acoustic wave from the piezoelectric layer 50 into the semiconductor 30 and back.

As shown the piezoelectric layer may be positioned over one or more of the device elements of the integrated circuit in order to minimize space. The occurrence of such elements does not interfere with the propagation of the acoustic wave to any substantial degree nor is operation of such elements substantially affected but, of course, where space is available the piezoelectric layer may be positioned over completely inactive portions of the semiconductor body.

The Q of the device is also influenced by the area of the resonator which preferably should be maximized. In general Q's in excess of about 100 can be achieved with a resonator having dimensions of about 40 mils on a side.

Since the acoustic wave is reflected from the lower surface 32 of the semiconductor body 30, a substantial acoustic mismatch must occur between the semiconductor 30 and the material or materials on which it is mounted. This imposes no difficult requirement because of the normal difference in the acoustic impedance of semiconductors such as silicon and those metals such as gold on which they are usually mounted, so that high losses can be easily avoided. A preferred thickness for the metal layer 33 would be an odd integral multiple of one quarter of the acoustic wavelength in accordance with Newell U.S. Pat. 3,414,832, issued Dec. 13, 1968 and assigned to the assignee of the present invention. Whatever mounting technique is employed, the lower surface of the semiconductor body should remain essentially planar.

The mounting technique illustrated is merely by way of example. It is also suitable to employ a face down mounting technique such as those commonly referred to as "flip-chip" and "beam lead" techniques.

Various techniques may be employed for the deposition of piezoelectric layers of suitable thickness. For example, cadmium sulfide may be vacuum evaporated as a compound, it being helpful to provide excess elemental sulfur in the system during the deposition process to insure a stoichiometric cadmium sulfide layer. The cadmium sulfide film may alternatively be formed by the co-evaporation of cadmium and sulfur as is disclosed in an article by deKerk and Kelly, Review of Scientific Instruments, vol. 36, p. 506, 1965.

The piezoelectric layer may be formed in its desired configuration, as well as the metal electrodes for it, by deposition of material through suitable masks. Alternatively, subtractive methods employing deposition of continuous layer with removal as by photoresist and etching techniques may be employed.

Devices in accordance with this invention are only slightly temperature dependent because semiconductor materials such as silicon have a coefficient of velocity with temperature of less than 30 parts per million which means there is a phase shift of only about 4500 Hertz per degree centigrade at 150 megaHertz.

For thickness control during the deposition of the piezoelectric layer 50, and possibly also the electrode layer 40*a*, the thickness may be continually monitored during deposition using quartz crystal microbalances, as is well known.

The lower limit of the frequency range of operation of the devices in accordance with this invention will be set by the technical difficulty of producing thick uniform piezoelectric layers. Layers of cadmium sulfide thicker than about 30 microns tend to have a rough surface and easily peel from a silicon surface. The upper frequency limit will be set by the acoustic losses in the system. Resonant frequencies higher than 400 megaHertz have been observed.

Figure 2:
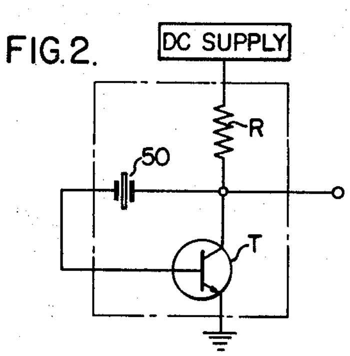
FIGS. 2 and 3 are circuit schematics illustrating, respectively, a basic oscillator circuit and a basic tuned amplifier circuit that may be integrated in accordance with the present invention and employ structures such as that illustrated in FIG. 1.
Figure 3:
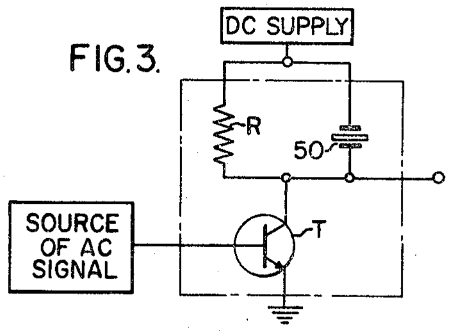

FIGS. 2 and 3 each show within the dashed line, the approximate equivalent circuit of the structure shown in FIG. 1. In FIG. 2 they are connected in a manner to provide an oscillator wherein the piezoelectric element 50 is coupled across the collector and base of transistor T. A DC supply is coupled to the remote end of resistor R.

In FIG. 3 the elements are connected to provide a tuned amplifier wherein the piezoelectric element 50 is connected in a filter configuration with the resistor R with the signal source and DC supply as indicated. It will be apparent that these basic circuits are merely representative of the types of applications in which the present invention may be practiced. In its broader aspects the invention may be employed in those types of circuits as are conventional, discrete tuning elements.

Figure 4:
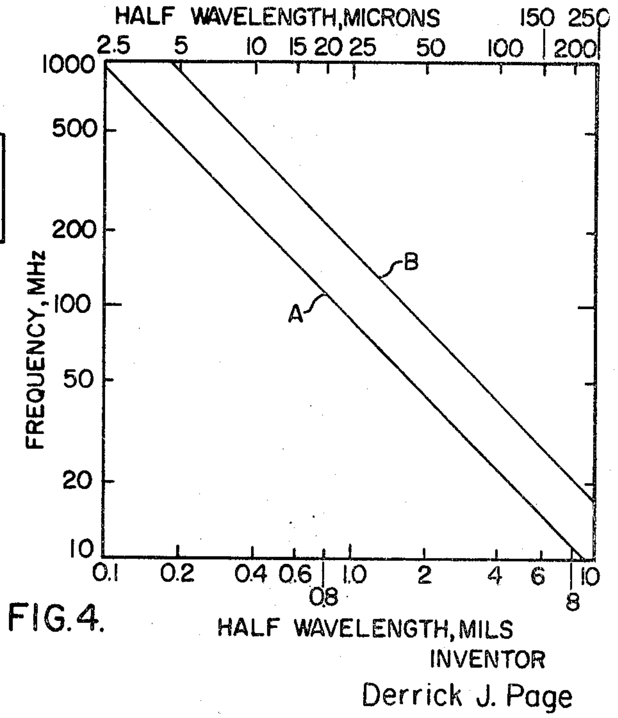
FIG. 4 is a graph of data to facilitate the design of integrated tuning devices in accordance with this invention utilizing cadmium sulfide as the piezoelectric layer and silicon as the semiconductor body.

FIG. 4 shows how one may determine appropriate thicknesses for silicon and cadmium sulfide to achieve a particular resonant frequency. Here one refers to the vertical scale for the frequency of interest. Taking 200 megaHertz as an example one proceeds to find a point on the line A representing the variation of frequency with thickness of cadmium sulfide that the half wavelength thickness would be near 10 microns and, similarly, the half wavelength thickness in silicon from line B would be 20 microns, which may be scaled up to provide a convenient silicon thickness of some integral multiple of that figure.

For purposes of verifying the principles of this invention a one mil thick cadmium sulfide layer was deposited in a vacuum system by the direct evaporation of cadmium sulfide, through an area defining mask, onto a silicon slice, 3 mils thick, heated to about 200° C. To insure correct stoichiometry and a high resistivity cadmium sulfide film, sulfur was also evaporated during the deposition. Before and after the cadmium sulfide deposition evaporations were performed for electrodes of successive layers of chromium and gold in a separate vacuum system. The composition of the electrode layers in not critical but may be variously selected.

The silicon employed was bare, that is, any oxide occurring was that only formed during the handling and formation of the cadmium sulfide layer and it has not been intentionally subjected to oxidation.

Figure 5:
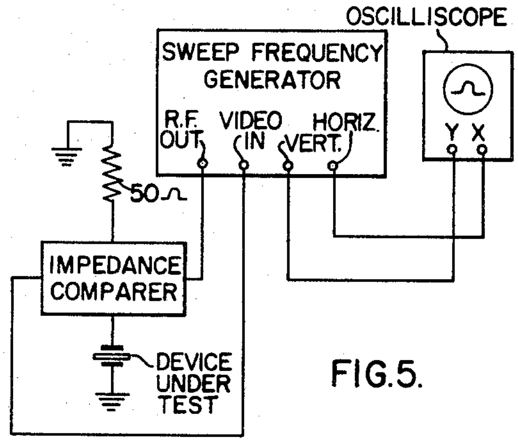
FIG. 5 is a circuit schematic of a circuit used to test examples of the present invention.

A test circuit was employed as illustrated in FIG. 5. In this test setup the device impedance was compared with 50 ohms using an impedance comparer available commercially as a Telonic Rho Tector, Model TRB-1, which was fed by a sweep frequency generator available commercially as Texscan VS-80A. The result was displayed on an oscilloscope. For the above example, resonance occurs at 103.5 megaHertz corresponding to a single wavelength in the cadmium sulfide and two half wavelengths in the silicon. The bandwidth of this device is less than one megaHertz, corresponding to a Q in excess of 100. The device was about 40 mils on each side in area. Units formed 20 mils on each side have been prepared with slightly lower Q. Other thickness cadmium sulfide layers and silicon bodies have been employed with successful results.

Amony other forms the invention may take is that incorporating thin or thick film active and/or passive elements on a solid support such as one of glass or ceramic and providing on that body a resonator in accordance with this invention. Generally, however, the acoustic properties of glasses and ceramics are not as favorable as those of monocrystalline silicon.

While the invention has been shown and described in a few forms only it will be apparent that various changes and modifications may be made without departing from the spirit and scope thereof.

What is claimed is:

1. In combination: a semiconductor body having a pair of planar and parallel surfaces; a first metal electrode supported by and parallel to one of said planar surfaces and in physical contact with at least a portion of said planar surface; a layer of piezoelectric material on said first metal electrode; a second metal electrode on said piezoelectric layer, said first and second metal electrodes being parallel; said semiconductor body having an acoustic thickness between said pair of planar surfaces that is an integral multiple of the acoustic thickness of said piezoelectric layer.

2. The subject matter of claim 1 further comprising: said semiconductor body containing at least one semiconductor device element electrically coupled to at least one of said first and second metal electrodes so that said device element is tuned to the resonant frequency of said piezoelectric layer.

3. The subject matter of claim 1 wherein: said semiconductor body is solidly mounted and an acoustic mismatch occurs between the opposite planar surface and material adjacent thereto.

References Cited

UNITED STATES PATENTS

| | | | |
|---|---|---|---|
| 3,294,988 | 12/1966 | Packard. | |
| 3,416,036 | 12/1968 | Ho | 331—116X |
| 3,414,779 | 12/1968 | Bohm | 310—8.1X |
| 3,453,711 | 7/1969 | Miller | 310—8X |
| 3,460,005 | 8/1969 | Kanda et al. | 317—235/21.1up |

PAUL L. GENSLER, Primary Examiner

U.S. Cl. X.R.

307—303; 310—8.2; 317—235; 324—58; 330—38; 331—108, 116; 333—82